United States Patent [19]

Sasa et al.

[11] Patent Number: 4,985,337
[45] Date of Patent: Jan. 15, 1991

[54] IMAGE FORMING METHOD AND ELEMENT, IN WHICH THE ELEMENT CONTAINS A RELEASE LAYER AND A PHOTOSENSITIVE O-QUINONE DIAZIODE LAYER

[75] Inventors: Nobumasa Sasa; Kunio Shimizu; Manabu Watanabe, all of Hino; Toshiyuki Urano, Machida; Shinya Mayama, Yamato; Tetsuya Masuda, Yokohama, all of Japan

[73] Assignees: Konica Corporation; Mitsubishi Kasei Corporation, both of Tokyo, Japan

[21] Appl. No.: 434,083

[22] Filed: Nov. 9, 1989

[30] Foreign Application Priority Data

Nov. 15, 1988 [JP] Japan .................. 63-288457
Dec. 26, 1988 [JP] Japan .................. 63-328716

[51] Int. Cl.$^5$ .................. G03C 1/52
[52] U.S. Cl. .................. 430/254; 430/192; 430/193; 430/258; 430/263; 430/271; 430/293; 430/326
[58] Field of Search .................. 430/253, 254, 257, 258, 430/293, 143, 192, 262, 263

[56] References Cited

U.S. PATENT DOCUMENTS

| 3,764,318 | 10/1973 | Laridon .................. 430/257 |
| 3,775,113 | 11/1973 | Bonham et al. .................. 430/257 |
| 4,093,464 | 6/1978 | Ruckert et al. .................. 430/192 |
| 4,288,520 | 9/1981 | Sprintschnik et al. .................. 430/302 |
| 4,339,530 | 7/1982 | Sprintschnik et al. .................. 430/331 |
| 4,592,946 | 6/1986 | Shuman .................. 430/348 |
| 4,619,952 | 10/1986 | Hart et al. .................. 523/410 |
| 4,638,020 | 1/1987 | Christenson et al. .................. 523/406 |
| 4,741,791 | 5/1988 | Howard et al. .................. 428/90 |

Primary Examiner—Paul R. Michl
Assistant Examiner—John S. Y. Chu
Attorney, Agent, or Firm—Frishauf, Holtz Goodman & Woodward

[57] ABSTRACT

There is disclosed an image forming method which comprises forming an image portion by exposing and developing an image forming material having a light-sensitive composition, and transferring only the image portion onto an image receiving material with the non-image portion of the image receiving material being exposed, wherein the light-sensitive composition contains:

(1) at least one selected from:
  (a) o-quinonediazide compounds; and
  (b) compositions containing both of a photoacid generating agent and a compound having at least one bond decomposable with the acid; and
(2) a polymeric compound having a structure unit represented by the following formula in the molecular structure:

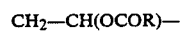

$$-CH_2-CH(OCOR)-$$

wherein R represents an alkyl group having 1 to 17 carbon atoms.

44 Claims, No Drawings

IMAGE FORMING METHOD AND ELEMENT, IN WHICH THE ELEMENT CONTAINS A RELEASE LAYER AND A PHOTOSENSITIVE O-QUINONE DIAZIODE LAYER

BACKGROUND OF THE INVENTION

This invention relates to an image forming method by use of an image forming material having a light-sensitive composition. The present invention can be utilized as, for example, the transfer image forming method of a color proof for color correction in color printing.

A light-sensitive composition containing an o-quinonediazide compound or a light-sensitive composition containing a photoacid generating agent, a compound having at least one bond decomposable with acid has been used in the field of, for example, light-sensitive materials for printing. Prior to real printing in multi-color printing, a color sheet called color proof may be sometimes used, and for example, as the light-sensitive composition for constituting such color proof, this kind of light-sensitive composition may be used.

The compound as described above is generally used together with a polymeric compound which can function as the binder.

As the prior art of this kind, light-sensitive compositions having an o-quinonediazide compound and a novolak type phenol resin are disclosed in Japanese Unexamined Patent Publication (PCT) No. 5012/1981, Japanese Unexamined Patent Publications Nos. 97140/1984 and 41830/1972, and also examples of the light-sensitive compositions containing a photoacid generating agent, a compound having at least one bond decomposable with acid and a novolak type phenol resin are disclosed in Japanese Unexamined Patent Publications Nos. 247348/1987, 247349/1987 and 291634/1987.

However, when a light-sensitive material is formed by use of such light-sensitive composition of the prior art, subjected to exposure and development to obtain an image and said image is transferred onto an image receiving material such as paper, heating at a high temperature is required for the transfer. For this reason, the image receiving material such as paper or the light-sensitive material itself may be sometimes expanded or deformed by heat, whereby dimensional slippage of the transfer image will be brought about.

Such dimensional slippage is a crucial problem when the light-sensitive material used as, for example, the color proof for correction as described above. This is because dimensional slippage between multicolor images may be sometime brought about.

Also, the above-mentioned light-sensitive composition by use of a novolak type phenol resin of the prior art has a problem of inferior discoloration resistance.

Further, an image forming material using copolymer resin of vinyl acetate/crotonic acid as a binder is also disclosed in Japanese Unexamined Patent Publications Nos. 2040/1988 and 298337/1988. But they all relate to an image forming method transferring colored image to the image receiving paper together with release layer, consequently problems such that an non-image portion is glossy and has a different appearance in its quality from that of acutal printed matter are involved therein.

An object of the present invention is to solve the problems of the prior art as mentioned above and provide an image forming method which obtains a transferred image with a light-sensitive material by transferring only image by use of a light-sensitive composition, which requires no high temperature heating for transfer even when applied to a transfer type light-sensitive material and therefore is free from dimensional slippage, etc.

Also, another object of the present invention is to provide an image forming method as mentioned above by use of a light-sensitive composition with good discoloration resistance.

SUMMARY OF THE INVENTION

The above object of the present invention can be accomplished by an image forming method which comprises forming an image portion by exposing and developing an image forming material having a light-sensitive composition, and transferring only said image portion onto an image receiving material with the non-image portion of the image receiving material being exposed, wherein said light-sensitive composition contains:

(1) at least one selected from:
  (a) o-quinonediazide compounds; and
  (b) compositions containing both of a photoacid generating agent and a compound having at least one bond decomposable with the acid; and (2) a polymeric compound having a carboxylic acid vinyl ester polymer unit represented by the following formula in the molecular structure:

$$RCOOCH=CH_2$$

wherein R represents an alkyl group having 1 to 17 carbon atoms.

DESCRIPTION OF THE PREFERRED EMBODIMENTS

In the present invention, the content of the o-quinonediazide compound in the light-sensitive cOmposition should be preferably 5 to 50 % by weight, more preferably 10 to 30 % by weight in the total solids.

In the present invention, the content of the photoacid generating agent in the light-sensitive composition should be preferably 0.1 to 10 % by weight, more preferably 0.2 to 5 % by weight, in the total solids in the light-sensitive composition. The content of the acid decomposed compound should be preferably 5 to 70 % by weight, more preferably 10 to 50 % by weight, on the same basis. The polymeric compound should be preferably 30 to 95 % by weight, more preferably 50 to 90 % by weight, on the same basis.

The present invention is described below in more detail.

The light-sensitive composition of the present invention contains at least one of (a) an o-quinonediazide compound and (b) a composition containing both of a photoacid generating agent and an acid decomposable compound.

As the o-quinonediazide compound to be used in the present invention, any of those which can function as the light-sensitive agent can be used.

Specifically, for example, the compounds obtained by condensation of 1,2-benzoquinonediazide-4-sulfonyl chloride, 1,2-naphthoquinonediazide-4-sulfonyl chloride, 1,2-naphthoquinonediazide-5-sulfonyl chloride, 1,2-naphthouinonediazide-6-sulfonyl chloride with hydroxyl group and/or amino group containing compounds may be preferably used.

As the hydroxyl group-containing compound, there may be included, for example, trihydroxybenzophenone, dihydroxyanthraquinone, bisphenol A, phenol novolak resin, resorcin benzaldehyde condensed resin, pyrogallol acetone condensed resin, etc. As the amino group containing compound, for example, there are aniline, p-aminodiphenylamine, p-aminobenzophenone, 4,4'-diaminodiphenylamine, 4,4'-diaminobenzophenone, etc.

Including those described here, concerning quinonediazide compounds, reference can be further made to "Light Sensitive System" (John Wily & Sons, New York, published in 1965) written by J. Kosar, and "Light-sensitive Polymers" written by Nagamatsu and Inui (Kodansha, published in 1977).

The photoacid generating agent to be used in the present invention means a compound which can generate an acid by irradiation of active ray. As such photoacid generating agent, many known compounds such as diazonium salts, phosphonium salts, sulfonium salts, and iodonium salts of $BF_4-$, $PF_8-$, $SbF_8-$, $SiFe_8^{2-}$, $ClO_4-$, organic halogen compounds, o-quinonediazidesulfonyl chloride, etc. can be used and also organometallic/organic halide compounds can be used as the active ray sensitive component which forms or separates an acid during irradiation of active ray.

In principle, all organic halide compounds known as free radical forming light-sensitive initiators can be used as the photoacid generating agent which can form hydrohalogenic acid. Examples of such compounds are disclosed in U.S. Pat. Nos. 3,515,552, 3,536,489, 3,779,778, and West German Unexamined Publication No. 2,243,621.

Also, compounds generating acid by photolysis are disclosed, for example, in West German Unexamined Publication No. 2,610,842, Japanese Unexamined Patent Publication Nos. 74728/1979, 77742/1980, 16323/1982 and 3626/1985.

The specific examples are described as follows.

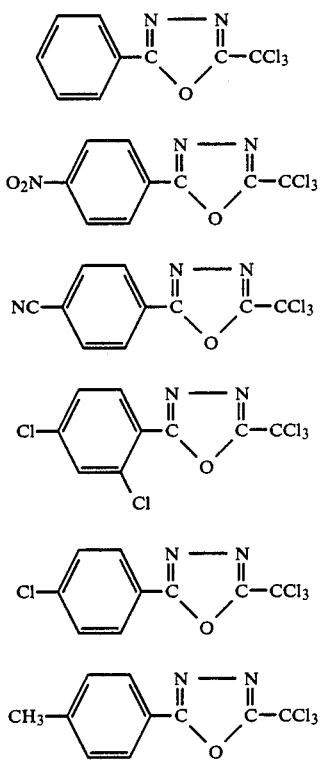

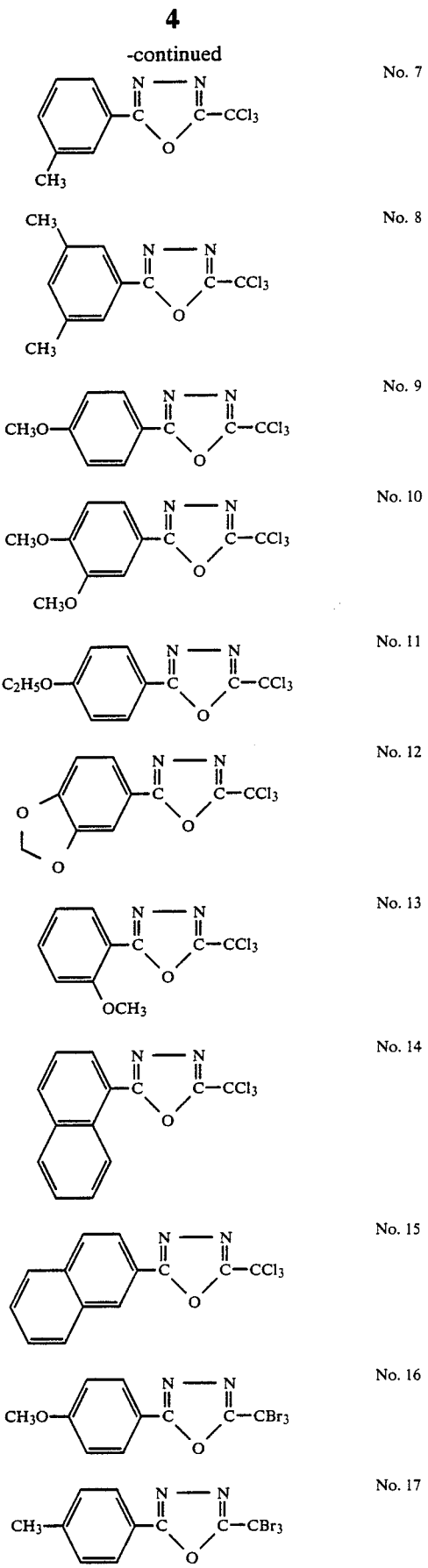

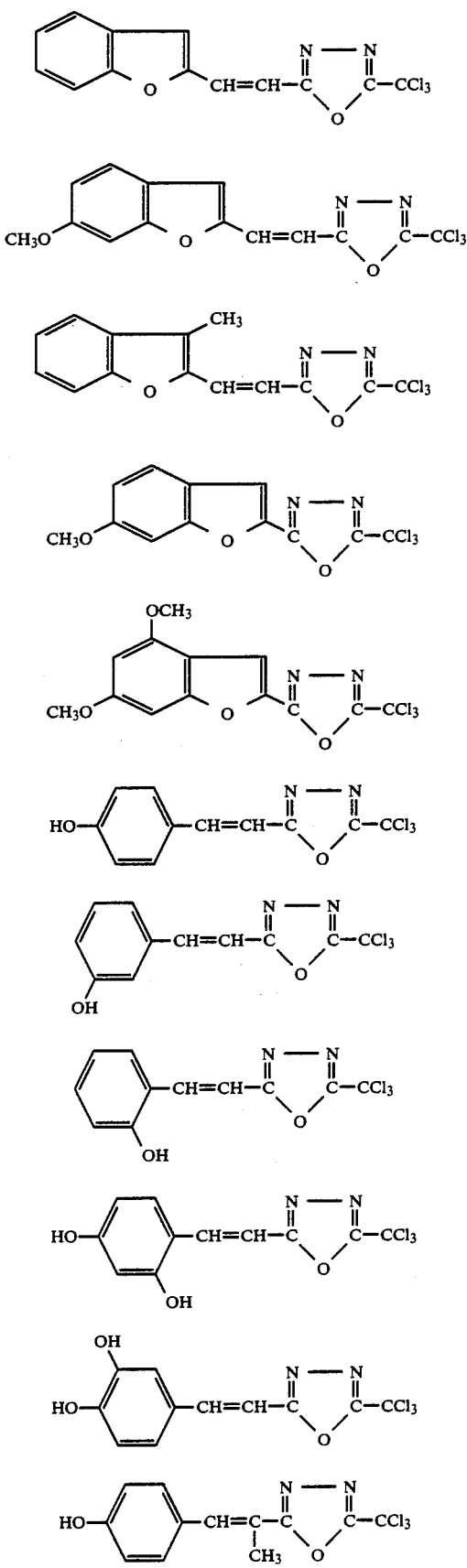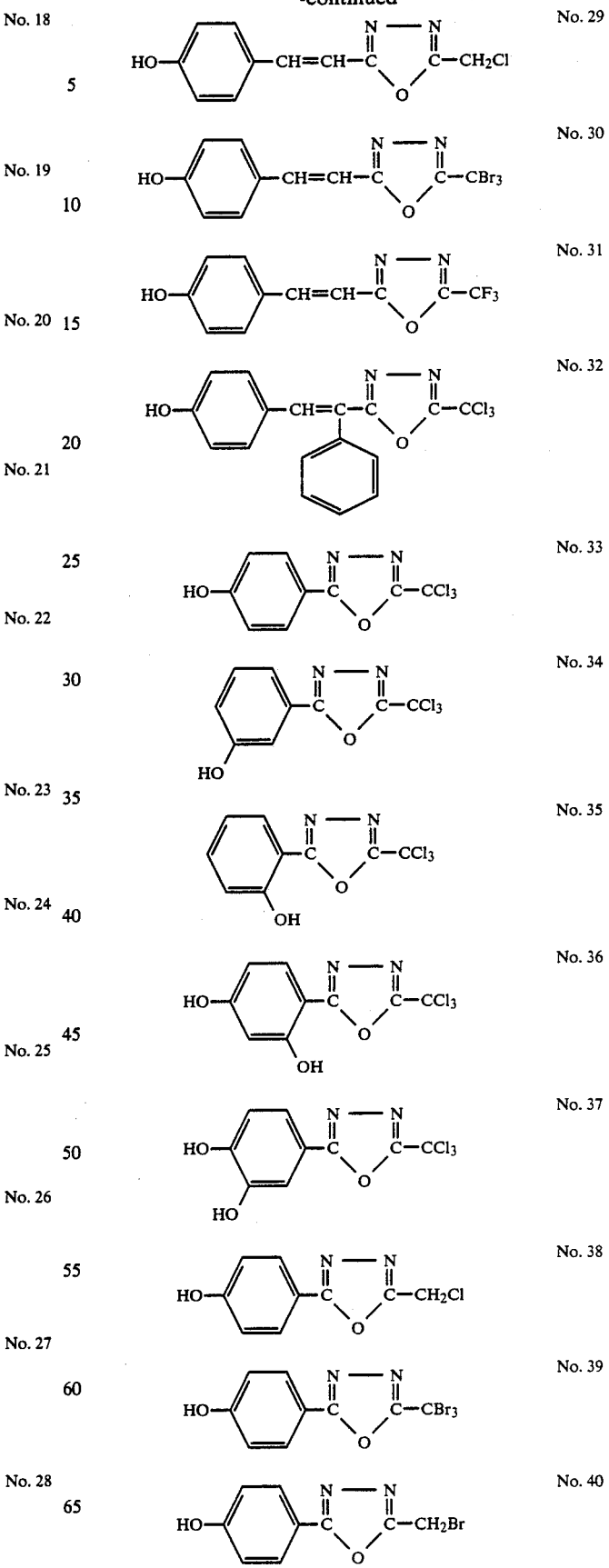

-continued

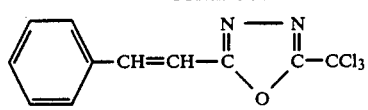

No. 41

Further, o-naphthoquinonediazide-4-sulfonic halogenide disclosed in Japanese Unexamined Patent Publication No. 6209/1975 can be also used.

Next, the light-sensitive composition of the present invention contains an acid decomposable compound together with the above-mentioned photoacid generating agent. As the compound having a bond decomposable with an acid by receiving the acid generated by such photoacid generating agent (acid decomposable compound), there may be included, for example, a compound having

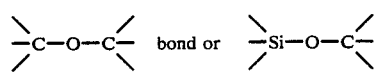

bond, or a compound having

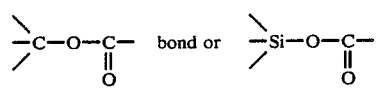

bond.

Examples of specific compound having —C—O—C— bond may include compounds having acetal or ketal group, compounds having ortho-carboxylic acid ester group and/or carboxylic acid amideacetanol group as disclosed in Japanese Unexamined Patent Publication No. 120714/1976, polymers having acetal or ketal group in the main chain as disclosed in Japanese Unexamined Patent Publication No. 13342/1978, compound having enol ether group as disclosed in Japanese Unexamined Patent Publication No. 12995/1980, compounds having N-acylimino carbonic acid salt group as disclosed in Japanese Unexamined Patent Publication No. 126236/1980, or polymers having ortho-carboxylic acid ester group in the main chain as disclosed in Japanese Unexamined Patent Publication No. 17345/1981.

Examples of specific compounds having

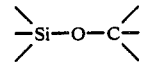

bond may include compounds as disclosed in Japanese Unexamined Patent Publication No. 37549/1985, 52845/1985 or 5 121446/1985.

Examples of specific compounds having ester group may include compounds as disclosed in Japanese Unexamined Patent Publication No. 3625/1985 or 10247/1985.

Among these compound having bond decomposable with acid, compounds having

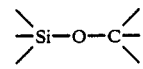

bond are preferred. Above all, compounds having at least one

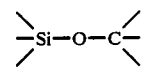

bond and also at least one hydrophilic group as disclosed in Japanese Unexamined Patent Publication No. 121446/1985 are particularly preferred.

Specific examples of the compound having bond decomposable with acid are as follows.

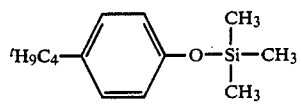

No. 1

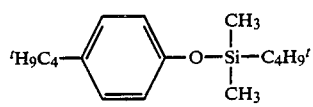

No. 2

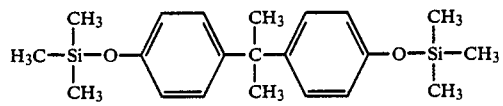

No. 3

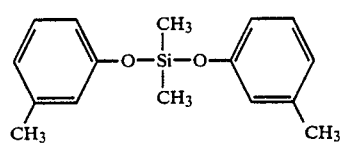

No. 4

No. 5
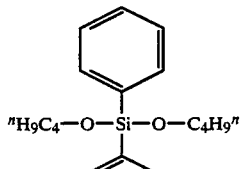
No. 6
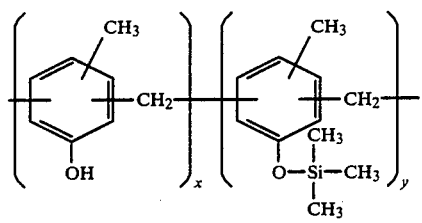
x/y = 0/100~95/5
No. 7
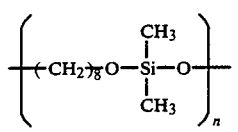
No. 8
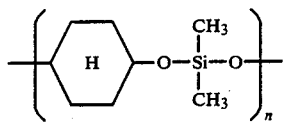
No. 9
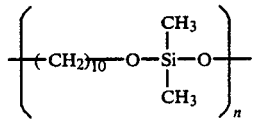
No. 10
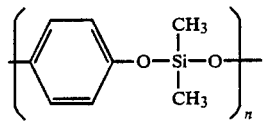
No. 11
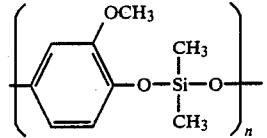
No. 12
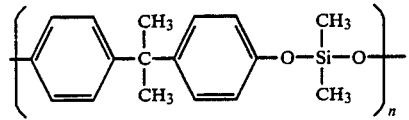
No. 13
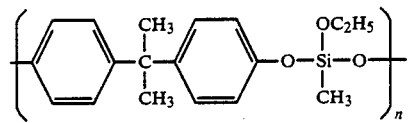

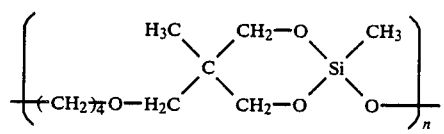
No. 14
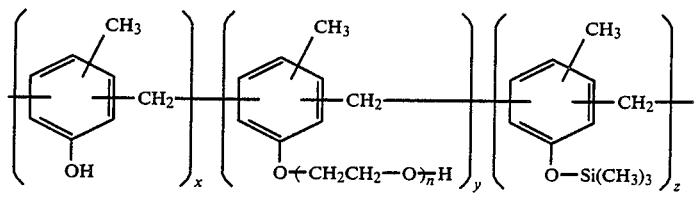
No. 15
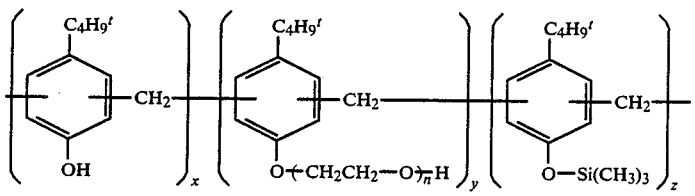
No. 16
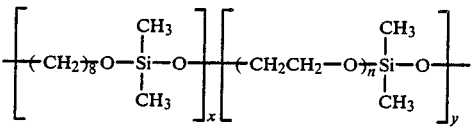
No. 17
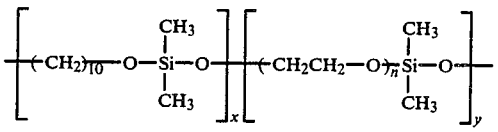
No. 18
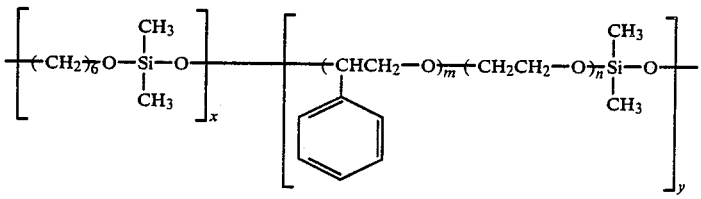
No. 19
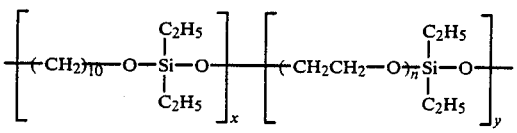
No. 20
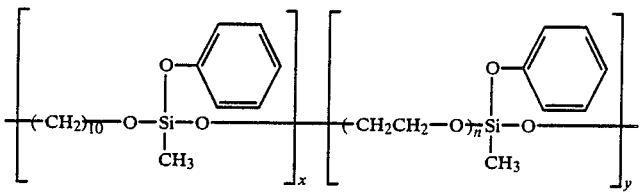
No. 21
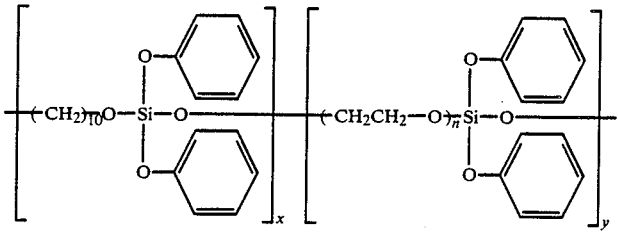
No. 22

-continued
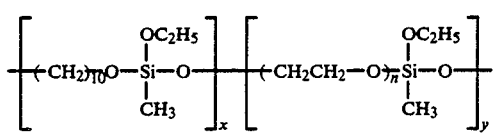 No. 23
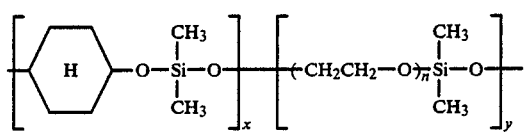 No. 24
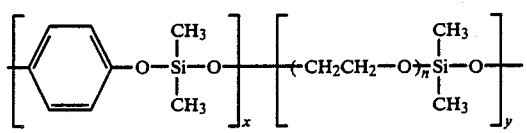 No. 25
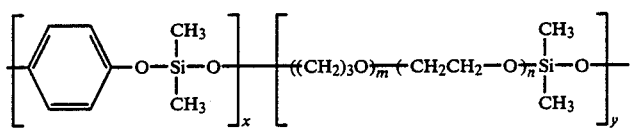 No. 26
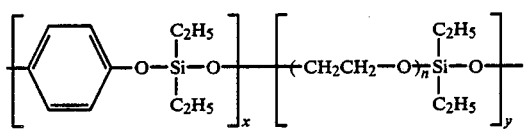 No. 27
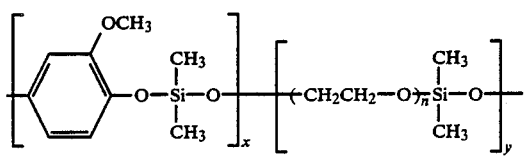 No. 28
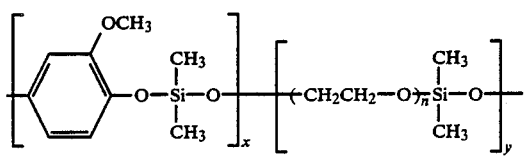 No. 29
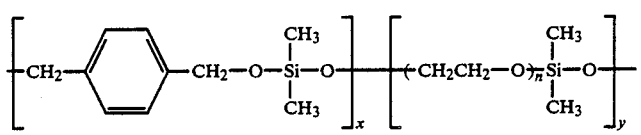 No. 30
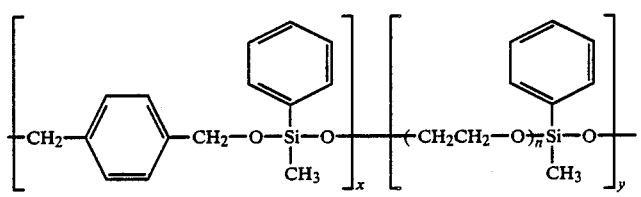 No. 31
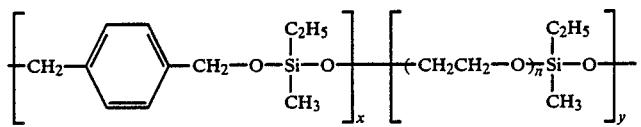 No. 32
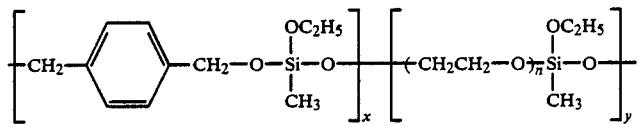

No. 33
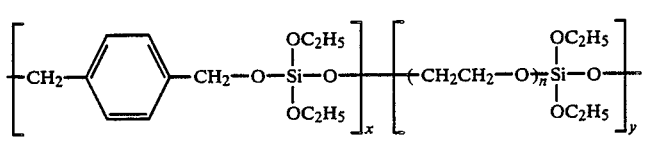
No. 34
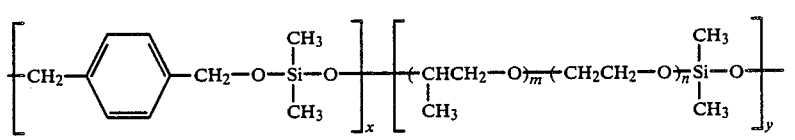
No. 35
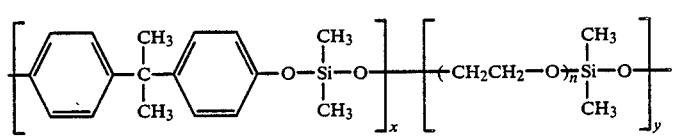
No. 36
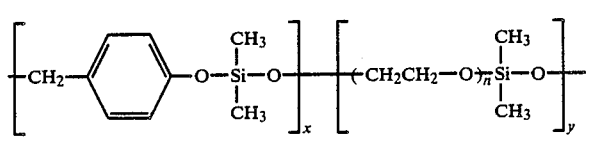
No. 37
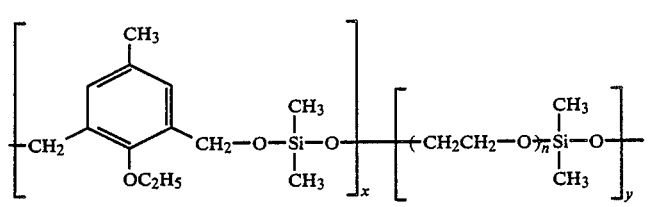
No. 38
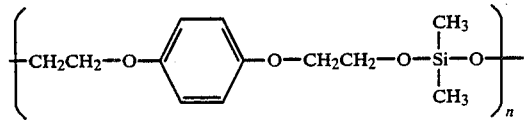
No. 39
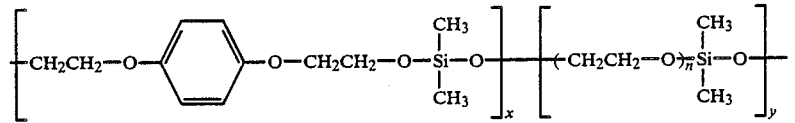
No. 40
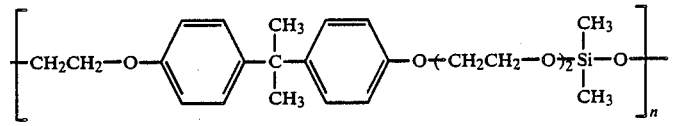
No. 41
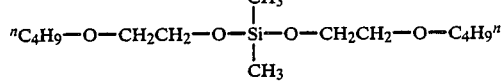
No. 42
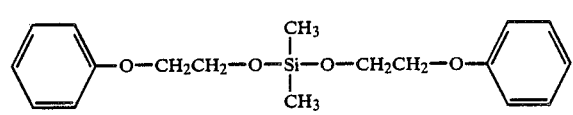
No. 43
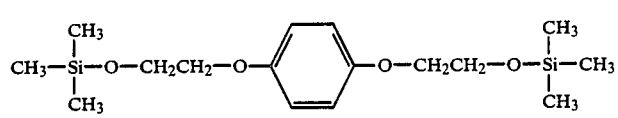

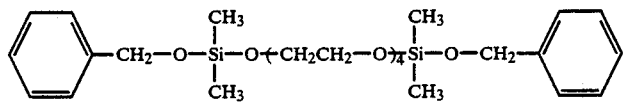  No. 44
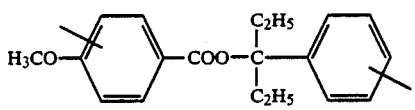  No. 45
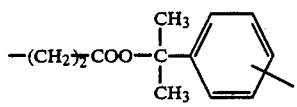  No. 46
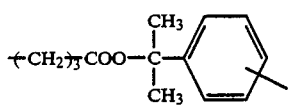  No. 47
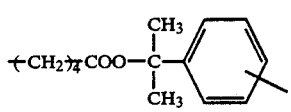  No. 48
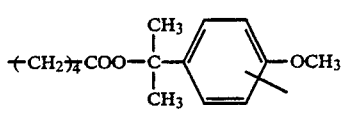  No. 49
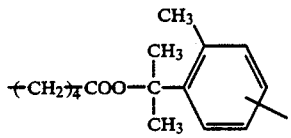  No. 50
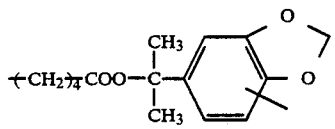  No. 51
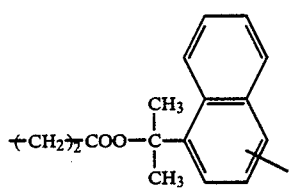  No. 52
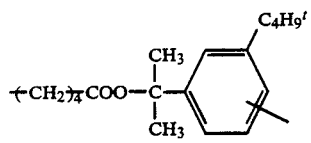  No. 53
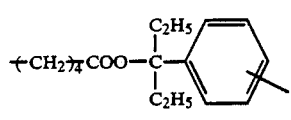  No. 54
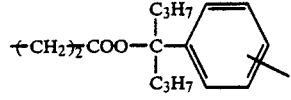  No. 55

-continued
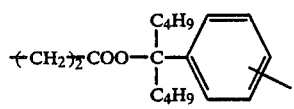
No. 56
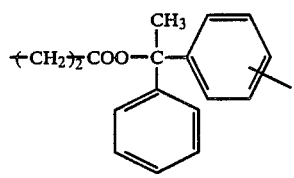
No. 57
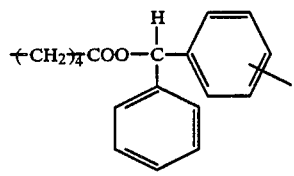
No. 58
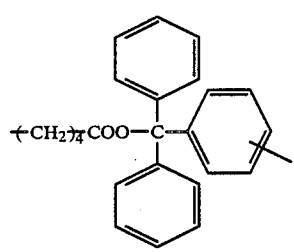
No. 59
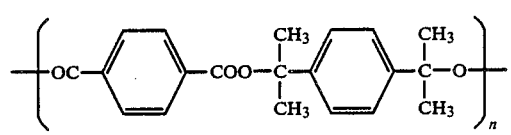
No. 60
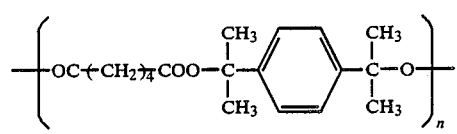
No. 61
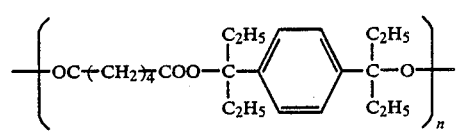
No. 62
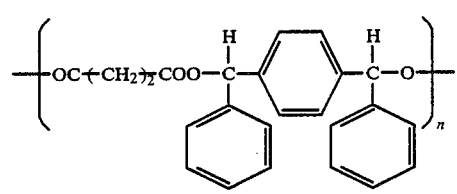
No. 63
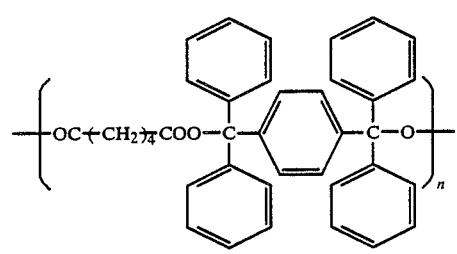
No. 64

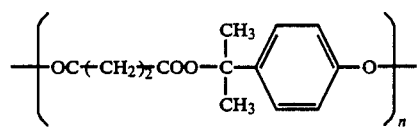

No. 65

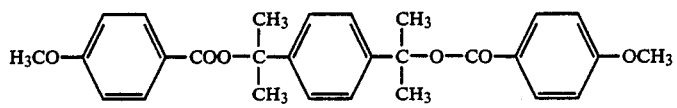

No. 66

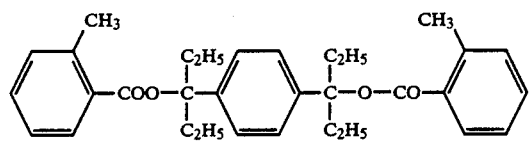

No. 67

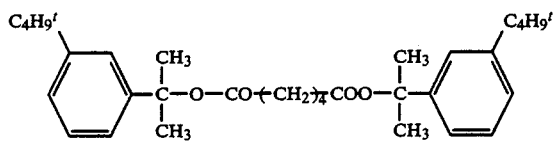

No. 68

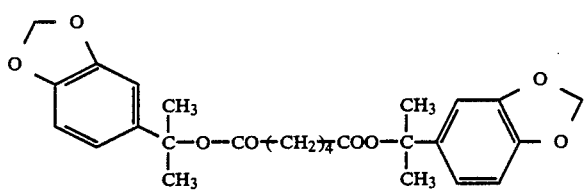

No. 69

TABLE

|  |  | m-cresol: p-cresol ratio | Photosensitive compound (parts by weight) | Curcumin ester (% by weight) | Cross sectional profile | Photosensitivity, m seconds |
|---|---|---|---|---|---|---|
| Example | 8 | 40:60 | V (15) VII (15) | I (3) | a | 200 |
|  | 9 | 20:80 | V (10) VII (20) | II (3) | a | 250 |
|  | 10 | 35:65 | V (10) VII (20) | III (3) | a | 220 |
|  | 11 | 15:85 | V (10) VII (20) | IV (3) | a | 270 |
|  | 12 | 43:57 | V (10) VII (20) | IV (1.5) | b | 180 |
|  | 13 | 40:60 | VI (10) VII (20) | I (3) | b | 150 |
|  | 14 | 60:40 | V (10) VII (20) | I (3) | b | 150 |
|  | 15 | 40:60 | V (20) VII (10) | I (3) | a | 550 |
|  | 16 | 47:53 | V (10) VII (20) | I (3) | b | 280 |
|  | 17 | 40:60 | V (5) VII (10) | I (17) | b | 400 |
| Comparative Example | 3 | 40:60 | — | IV (30) | c | 800 |
|  | 4 | 40:60 | V (2) VII (4) | IV (30) | c | 900 |

These compounds decomposable with acid may be used alone as one kind or as a mixture of two or more kinds.

Also, as acid decomposable compound compounds having at least one ortho-carbonic acid ester group represented by the following formula [X] can be preferably used:

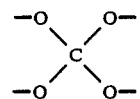

Examples of such compound having at least one ortho-carbonic acid ester group (hereinafter called ortho-carbonic acid ester compound) may include, for example, compounds which can be synthesized by subjecting at least one of compounds having at least one phenolic OH group and/or at least alcoholic OH group (hereinafter called OH group containing compound) and a tetraalkoxymethane to interesterification reaction of one step or two or more steps.

For such interesterification reaction, the same method as described in Svensk Kem. Tidskr. 65, 10 (1953),etc., or similar method can be used.

As the above-mentioned OH group containing compound, for example, monohydric alcohols, dihydric alcohols, trihydric alcohols, 4 or more hydric alcohols, monohydric phenolic compounds, dihydric phenolic compounds, trihydric phenolic compounds, 4 or more hydric phenolic compounds, or compounds having at the same time phenolic OH group and alcoholic OH group, etc. can be included.

Examples of the above-mentioned monohydric alcohol may include aliphatic alcohols such as n-propyl alcohol, n-butyl alcohol, n-pentyl alcohol, n-hexyl alcohol, n-heptyl alcohol, n-octyl alcohol, n-decyl alcohol, n-dodecyl alcohol, n-tetradecyl alcohol, n-hexadecyl alcohol, n-octadecyl alcohol, isopropyl alcohol, isobutyl alcohol, sec-butyl alcohol, tert-butyl alcohol, isopentyl alcohol, active amyl alcohol, tert-pentyl alcohol, cyclopentanol, cyclohexanol, allyl alcohol, crotyl alcohol, methyl vinyl carbinol, ethylene glycol monomethyl ether, ethylene glycol monoethyl ether, diethylene glycol monomethyl ether, diethylene glycol monoethyl ether, triethylene glycol monomethyl ether, triethylene glycol monoethyl ether, etc., aromatic alcohols such as benzyl alcohol, α-phenylethyl alcohol, β-phenylethyl alcohol, diphenyl carbinol, triphenyl carbinol, cinnamyl alcohol, etc.

Examples of dihydric alcohols may include those disclosed in Japanese Unexamined Patent Publication No. 133429/1978, namely aliphatic alcohols such as pentane-1,5-diol, n-hexane-1,6-diol, 2-ethyl-hexane-1,6-diol, 2,3-dimethyl-hexane-1,6-diol, heptane-1,7-diol, cyclohexane-1,4-diol, nonane-1,7-diol, nonane-1,9-diol, 3,6-dimethyl-nonane-1,9-diol, decane-1,10-diol, dodecane-1,12-diol, 1,4-bis-(hydroxymethyl)-cyclohexane, 2-ethyl-1,4-bis-(hydroxymethyl)-cyclohexane, 2-methyl-cyclohexane-1,4-diethanol, 2-methyl-cyclohexane-1,4-dipropanol, thiodipropylene glycol, 3-methyl-pentane-1,5-diol, dibutylene glycol, oxypivalic acid-neopentyl glycol ester, 4,8-bis-(hydroxymethyl)-tricyclodecane, n-butene-(2)-1,4-diol, n-but-2-yne-1,4-diol, n-hex-3-yne-2,5-diol, 1,4-bis-(2-hydroxyethoxy)-butyne-(2), p-xylylene glycol, 2,5-dimethyl-hex-3yne2,5-diol, bis-(2-hydroxyethyl)-sulfide, 2,2,4,4-tetra-methylcyclobutane-1,3-diol, di-, tri-, tetra-, penta- and hexaethylene glycol, di- and tripropylene glycol and polyethylene glycols with average molecular weights of 200, 300, 400 and 600, etc., aromatic alcohols such as p-xylylene glycol, 2-methyl-2-phenyl-1,3-propane diol, etc.

Examples of trihydric alcohols may include those disclosed in Japanese Unexamined Patent Publication No. 17345/1981, namely aliphatic or aromatic alcohols such as glycerol, butane-1,2,4-triol, 2-hydroxymethyl-butane-1,4-diol, pentane-1,2,5-triol, 2-hydroxymethyl-pentane-1,5-diol, hexane-1,2,5-triol, 2-hydroxymethyl-hexane-1,6-diol, hexane-1,2,6-triol, 4-ethyl-hexane-1,4,5-triol, heptane-1,4,5-triol, 1-(1,2-dihydroxyethyl)-4-hydroxy-methylbenzene, 2,4,6-triethyl-5-propyl-heptane-1,3,7-triol, 1-(2,3-dihydroxy-propoxy)-4-hydroxymethyl-benzene, 1-(2,3-dihydroxypropyl)-4-hydroxymethyl-benzene, octe-3-nyne-1,7,8-triol, octane-1,2,8-triol, octane-1,3,8-triol, nonane-1,4,5-triol, 3-(1-hydroxy-1-methyl-ethyl)-5-oxaoctane-2,8-diol, 2,6,8-trimethyl-3-hydroxymethyl-nonane-6,7-diol, 6,7-diol, 2-hydroxymethyl-3-oxa-heptane-1,7-diol and hexadecane-1,2,16-triol, etc.

As 4 or more hydric alcohols, for example, aliphatic alcohols such as pentaerythritol, threitol, pentitol, sorbitol, polyvinyl alcohol, etc. may be included. Also, aromatic alcohols may be available.

As monohydric phenolic compounds, for example, phenol, o-cresol, m-cresol, p-cresol, 3,5-xylenol, carvacrol, thymol, α-naphthol, β-naphthol, etc. may be included.

Dihydric phenolic compounds may include catechol, resorcin, hydroquinone, 2,2-bis(4-hydroxyphenyl)butane, bis(p-hydroxyphenyl)methane, 2,2-bis(4-hydroxyphenyl)-propyne, 2,3-dihydroxynaphthalene, 1,6-dihydroxy-naphthalene, 2,6-dihydroxynaphthalene, etc.

As trihydric phenolic compounds, pyrogallol, phloroglucin, etc. may be included.

As 4 or more hydric phenolic compounds, 1,4,9,10-tetrahydroxyanthracene, etc. may be included.

As the compound having at the same time phenolic OH and alcoholi OH, 2-(bis(4-hydroxyphenyl)methyl)-benzyl alcohol, etc. may be included.

As the above-mentioned tetraalkoxymethane, for example, tetramethoxymethane or tetraethoxymethane, etc. may be generally employed Tetraethoxymethane can be synthesized from, for example, chloropicrine and sodium ethoxide according to the method as described in Organic Synthesis Coll. Vol. IV, 457 (1963). Other tetraalkoxymethanes can be also synthesized according to similar methods. Also, they can be synthesized according to a method similar to that as described in J. Org. Chem., 36, 1176 (1971) or a method similar to that as described in J. Org. Chem., 37, 4198 (1972).

The above-mentioned ortho-carbonic acid ester compound can be obtained by, for example, reacting the above tetraalkoxymethane with the above OH group containing compound without use of a solvent at a temperature of 60° to 170° C., preferably 80° to 150° C. The liberated lower alcohol may be evaporated in some cases. At this time, it is preferable to carry out the reaction in the presence of an acidic catalyst such as p-toluenesulfonic acid or sulfuric acid, etc. In some cases, the reaction may be also carried out under reduced pressure. Also, an inert solvent under the above reaction conditions, for example, benzene, toluene, xylene, dioxane, chlorinated hydrocarbons, etc. can be also used as the reaction solvent. The liberated lower alcohol may be evaporated together with a part of the solvent in some cases.

The quantitative ratio in the reaction between the above-mentioned tetraalkoxymethane and the above-mentioned OH group containing compound may be generally made 4 moles of OH groups as the total per one mole of tetraalkoxymethane, but in some cases, other quantitative ratios from this may be available.

When two kinds of OH group containing compounds are used, the total three of tetraalkoxymethane and two kinds of OH group containing compounds may be subjected to the reaction at the same time, or in some cases, first the reaction of tetraalkoxymethane with one of the OH group containing compounds may be carried out, followed by the reaction of the product with the other OH group containing compound. When employing 3 or more kinds of OH group containing compounds, the reaction can be similarly carried out.

Also, synthesis is possible according to the same method as described in Chem. Ber. 544 (1961) or similarl method. For example, there may be employed the method in which

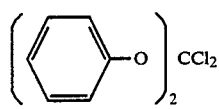

diphenyloxydichloromethane and the above-mentioned OH group containing compound are subjected to the reaction.

The product obtained by the above method is an orthocarbonic acid ester compound, and as an example of this, a compound containing one, two or more of ortho-carbonic acid ester group unit shown below or a mixture of them may be included.

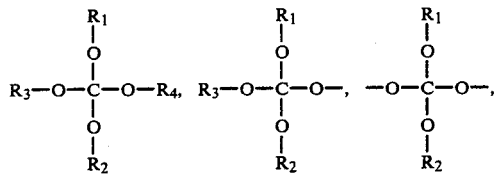

-continued

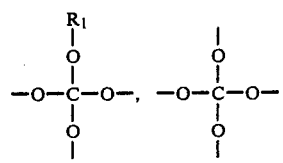

$R_1$, $R_2$, $R_3$ and $R_4$ in the above formulae each represent an alkyl, aryl, aralkyl or alkenyl group, etc. These alkyl, aryl, aralkyl, alkenyl groups having substituents are also included. Also, of $R_1$-$R_4$, at least two may be mutually bonded to form a ring.

Also, the portion of the bonding arm may be further bonded to one having the same one as described above or another ortho-carbonic acid ester group unit through substituted or unsubstituted alkylene, arylene, aralkylene, alkenyl group, etc.

Also, the above-mentioned compound having at least one ortho-carbonic acid ester group unit may be suitably 1 to 50 of ortho-carbonic acid ester group units in the molecule.

In the following, specific examples of the compounds having at least one ortho-carbonic acid ester group are shown.

Exemplary compounds.

| | |
|---|---|
| No. 1 | The reaction product between $(CH_3O)_4C$ and $HO(CH_2CH_2O)_3H$ |
| No. 2 | The reaction product between $(CH_3O)_4C$ and $HO(CH_2CH_2O)_4H$ |
| No. 3 | The reaction product between $(CH_3O)_4C$ and $HOCH_2CH(OH)C_3H_6CH_2OH$ |
| No. 4 | The reaction product between $(C_2H_5O)_4C$ and $HO(CH_2CH_2O)_2H$ |
| No. 5 | The reaction product between $(CH_3O)_4C$ and $(HOCH_2)_4C$ |
| No. 6 | The reaction product between $(C_2H_5O)_4C$ and $HOCH_2CH(OH)CH(OH)CH_2OH$ |
| No. 7 | The reaction product between $(C_4H_9O)_3C(OCH_3)$ and 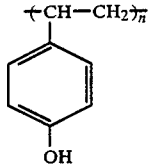 |
| No. 8 | The reaction product between $(CH_3O)_4C$ and $+CH-CH_2\frac{}{}_n$ with $OH$ |
| No. 9 | $(n$-$C_4H_9OCH_2CH_2O)_4C$ |

-continued

No. 10 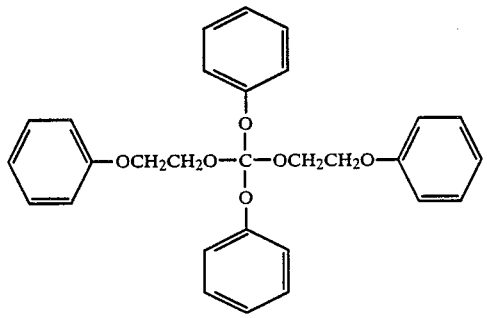

No. 11 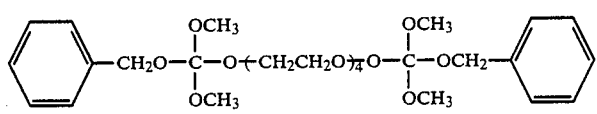

No. 12 The reaction product between $(C_2H_5O)_4C$ and

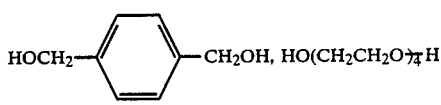 $CH_2OH$, $HO(CH_2CH_2O)_{\overline{4}}H$

No. 13 The reaction product between $(CH_3O)_4C$ and
$HO(CH_2CH_2O)_{\overline{3}}H$ and $HO(CH_2CH_2O)_{\overline{4}}H$ No. 14 The reaction product between $(n-C_4H_9O)_4C$ and
$HO(CH_2CH_2O)_{\overline{4}}H$, $HOCH_2CH(OH)C_3H_6CH_2OH$ No. 15 The reaction product between $(CH_3O)_4C$ and
$HO(CH_2CH_2O)_{\overline{2}}H$, $(HOCH_2)C$ No. 16 The reaction product between $(CH_3O)_4C$ and

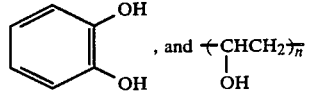, and $(CHCH_2)_{\overline{n}}$ with $OH$

No. 17 The reaction product between $(CH_3O)_4C$ and
$HOCH_2CH_2OH$, $HO(CH_2CH_2O)_{\overline{3}}H$ No. 18 The reaction product between

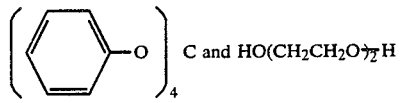 C and $HO(CH_2CH_2O)_{\overline{2}}H$

No. 19 The reaction product between

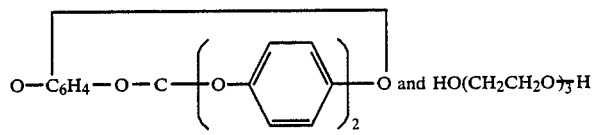 and $HO(CH_2CH_2O)_{\overline{3}}H$

No. 20 The reaction product between $(C_2H_5O)_4C$ and

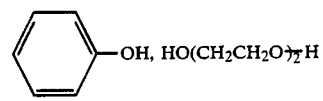—OH, $HO(CH_2CH_2O)_{\overline{2}}H$

No. 21 The reaction product between $(CH_3O)_4C$ and $HO(CH_2CH_2O)_{\overline{2}}H$, 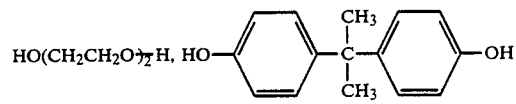

No. 22 The reaction product between

-continued

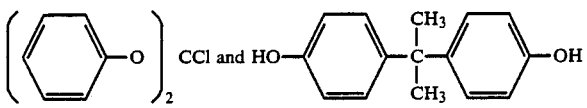

No. 23  The reaction production between

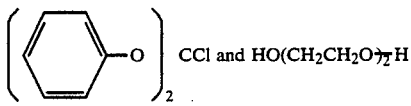  CCl and HO(CH$_2$CH$_2$O)$_{77}$H

No. 24  The reaction product between

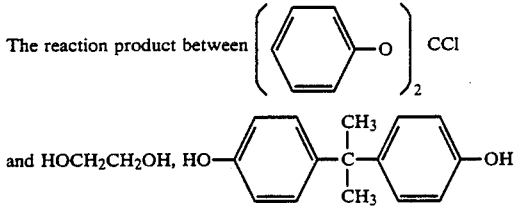

Next, the light-sensitive composition in the method of the present invention contains a polymeric compound having the carboxylic acid vinyl ester polymer unit represented by the following formula in the molecular structure:

$$RCOOH=CH_2$$

(wherein R represents an alkyl group having 1 to 17 carbon atoms).

Any of polymeric compounds having the structure as mentioned above can be used, but as the carboxylic acid vinyl ester monomer for constituting the polymer unit represented by the above formula, those as exemplified below are preferred. The names and the chemical formulae are listed together.

| | | |
|---|---|---|
| (1) | vinyl acetate | $CH_3COOCH=CH_2$ |
| (2) | vinyl propionate | $CH_3CH_3COOCH=CH_2$ |
| (3) | vinyl butyrate | $CH_3(CH_2)_2COOCH=CH_2$ |
| (4) | vinyl pivalate | $(CH_3)_3CCOOCH=CH_2$ |
| (5) | vinyl caproate | $CH_3(CH_2)_4COOCH=CH_2$ |
| (6) | vinyl caprylate | $CH_3(CH_2)_6COOCH=CH_2$ |
| (7) | vinyl caprate | $CH_3(CH_2)_8COOCH=CH_2$ |
| (8) | vinyl laurate | $CH_3(CH_2)_{10}COOCH=CH_2$ |
| (9) | vinyl myristate | $CH_3(CH_2)_{12}COOCH=CH_2$ |
| (10) | vinyl palmitate | $CH_3(CH_2)_{14}COOCH=CH_2$ |
| (11) | vinyl stearate | $CH_3(CH_2)_{16}COOCH=CH_2$ |
| (12) | vinyl versatate | $R^1-\underset{R^2}{\overset{CH_3}{C}}-COOCH=CH_2$ |

The above-mentioned R is also inclusive of alkyl group having substituents, that is, vinyl esters of substituted carboxylic acids are also included within the polymer unit.

The polymeric compound in the present invention may be a polymer having one kind of the above carboxylic acid vinyl esters polymerized, or a polymer having two or more of carboxylic acid vinyl esters copolymerized, and it may be also a copolymer of a carboxylic acid vinyl ester with another monomer copolymerizable therewith at any desired component ratio.

Examples of monomer units which can be used in combination with the polymer unit represented by the above formula may include:

ethylenic unsaturated olefins such as ethylene, propylene, isobutylene, butadiene, isoprene, and the like;

styrenes such as styrene, α-methylstyrene, p-methylstyrene, p-chlorostyrene, and the like;

acrylic acids such as acrylic acid, methacrylic acid, and the like;

unsaturated aliphatic dicarboxylic acids such as itaconic acid, maleic acid, maleic anhydride, and the like;

diesters of unsaturated dicarboxylic acids such as diethyl maleate, dibutyl maleate, di-2-ethylhexyl maleate, dibutyl fumarate, di-2-ethylhexyl fumarate, and the like;

α-methylene aliphatic monocarboxylic acid esters such as methyl acrylte, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate, and the like;

nitriles such as acrylonitrile, methacrylonitrile, and the like;

amides such as acrylamide, and the like;

anilides such as acrylanilide, p-chloroacrylanilide, m-nitroacrylanilide, m-methoxyacrylanilide, and the like;

vinyl monomers, for example, vinyl ethers such as methyl vinyl ether, ethyl vinyl ether, isobutyl vinyl ether, β-chloroethyl vinyl ether, and the like;

vinyl chloride, vinylidene chloride, vinylidene cyanide;

ethylene derivatives such as 1-methyl-1-methoxyethylene, 1,1-dimethoxyethylene, 1,2-dimethoxyethylene, 1,1-dimethoxycarbonylethylene, 1-methyl-1-nitroethylene, and the like;

N-vinyl compounds such as N-vinylpyrrole, N-vinylcarbozole, N-vinylindole, N-vinylpyrrolidene, N-vinylpyrrolidone, and the like. These monomers of the vinyl type, etc. exist in the polymeric compound with the structure of the unsaturated double bond being cleaved.

Of the polymeric compounds to be used in the present invention, particularly preferable are those having vinyl acetate polymer units in the molecular structure. Among them, those having 40 to 95 % by weight of vinyl acetate polymer units, number average molecular weight (MN) of 1,000 to 1000,000 and weight average molecular weight of 5,000 to 5000,000 are preferred.

More preferably, a polymeric compound having vinyl acetate polymer unit (particularly containing 40 to 95 % by weight of this unit) and carboxylic acid vinyl ester polymer unit with longer chain than vinyl acetate, (preferably with 4 to 17 carbon atoms, particularly vinyl versatate polymer unit, particularly containing 10 to 50 % by weight of this unit), may be employed, particularly those having number average molecular weight (MN) of 2,000 to 60,000 and weight average molecular weight (MW) of 10,000 to 150,000.

In this case, the monomer constituting the polymeric compound having vinyl acetate polymer unit to be copolymerized with vinyl acetate may be any desired one, provided that it can form a copolymer, and can be selected as desired from, for example, the monomers as exemplified above.

In the following, the copolymers which can be used as the polymeric compound in the present invention are enumerated by showing the monomeric components. As a matter of course, the following examples are not limitative of the present invention.

(1) vinyl acetate-ethylene
(2) vinyl acetate-styrene
(3) vinyl acetate-crotonic acid
(4) vinyl acetate-maleic acid
(5) vinyl acetate-2-ethylhexyl acrylate
(6) vinyl acetate-2-ethylhexyl maleate
(7) vinyl acetate-methyl vinyl ether
(8) vinyl acetate-vinyl chloride
(9) vinyl acetate-N-vinylpyrrolidone
(10) vinyl acetate-vinyl propionate
(11) vinyl acetate-vinyl pivalate
(12) vinyl acetate-vinyl versatate
(13) vinyl acetate-vinyl laurate
(14) vinyl acetate-vinyl stearate
(15) vinyl acetate-vinyl versatate-ethylene
(16) vinyl acetate-vinyl versatate-2-ethylhexyl acrylate
(17) vinyl acetate-vinyl versatate-vinyl laurate
(18) vinyl acetate-vinyl versatate-crotonic acid
(19) vinyl propionate-vinyl versatate
(20) vinyl propionate-vinyl versatate-crotonic acid
(21) pivalic acid-vinyl stearate-maleic acid.

The light-sensitive composition to be used in the method of the present invention can constitute an image forming material by use thereof. For example, it can be made a color image forming material in the case of being used as color proof, etc.

The colored light-sensitive layer of the colored image forming material in this case is removed imagewise by the development subsequent to imagewise exposure to form a colored image.

In the colored light-sensitive layer, dyes, pigments are added as the colorant. Particularly, when used for color correction, pigments, dyes with tones coincident with normal colors demanded there, namely yellow, magenta, cyan, black are required, or otherwise metal powder, white pigment, fluorescent pigment, etc. may be also used. When the present invention is applied to color proof, a large number of pigments and dyes known in this field of art as shown below can be used. (C.I. means color index)

Victoria Pure Blue (C.I. 42595)
Auramine (C.I. 41000)
Katiron Brilliant Flavin (C.I. Basic 13)
Rhodamine 6GCP (C.I. 45160)
Rhodamine B (C.I. 45170)
Safranine OK 70:100 (C.I. 50240)
Eliograucine X (C.I. 42080)
Fast Black HB (C.I. 26150)
No. 1201 Lionol Yellow (C.I. 21090)
Lionol Yellow GRO (C.I. 21090)
Symlar Fast Yellow 8GF (C.I. 21105)
Benzidine Yellow 4T-564D (C.I. 21095)
Symlar Fast Red 4015 (C.I. 12355)
Lionol Red 7B4401 (C.I. 15830)
Fastgen Blue TGR-L (C.I. 74160)
Lionol Blue SM (C.I. 26150)
Mitsubishi Carbon Black MA-100
Mitsubishi Carbon Black #30, #40, #50

| | |
|---|---|
| Lionol Blue | FG7391G |
| Lionol Blue | FG7393G |
| Lionol Blue | 700-10FG |
| Lionol Yellow | SGR-H |
| Lionol Yellow | FGN-H |
| Cyanine Blue | KRG |
| Cyanine Blue | 4012 |
| Cyanine Blue | RS-30 |
| Phthalocyanine Blue | 4933GNEP |
| Lionol Blue | FG7330 |
| Seika Fast Carmine | 1478 |
| Lionol Red | 6BFG-4219X |
| No. 1206 Lionol Yellow | |

In the present invention, it is necessary that no pigment components of the colored light-sensitive layer remain in the non-image portion after developing colored light-sensitive sensitive layer in view of finishing quality. Among the pigments as described above, it is preferably to use a pigment having an insoluble salt such as sulfonic acid, carbonic acid, amine, etc. Such pigments may be obtained by converting a soluble group of water-soluble dyes to an insoluble salt, or processed pigments treated by treating agents such as lecithin, naphthenic acid metallic salt, alkylbenzene sulfonate, dialkylnaphthalene sulfonate, mono- or di-alkylnaphthalene sulfonate, mono- or di-alkylsulfosuccinate, dialkylphosphate, rhodinate, or organic amine, etc.

When a colorant is used in the present invention, the ratio of colorant/binder in the colored light-sensitive layer can be determined by those skilled in the art according to the known method in view of the aimed optical density and the eliminability of the colored light-sensitive layer relative to the developer. For example, in the case of a dye, preferably its content may be 5 % to 75 % by weight, while in the case of a pigment, preferably its content may be suitably 5 % to 90 % by weight.

Also, the film thickness of the colored light-sensitive layer can be determined by those skilled in the art from the aimed optical density, the kind of the colorant to be used in the colored light-sensitive layer (dye, pigment, carbon black) and its content, but the resolving power becomes higher and the image quality is better as the film thickness of the colored light-sensitive layer is as thin as possible within the tolerable range. Therefore, said film thickness is generally used preferably within the range of 0.1 $g/m^2$ to 5 $g/m^2$.

In practicing the present invention, in the light-sensitive composition, further plasticities, coatablity enhancers, etc. can be also added, if necessary.

As the plasticizer, there may be included various low molecular compounds such as phthalates, triphenylphosphates, maleates, and as the coatability enhancer, surfactants such as fluorine type surfactants, nonionic surfactants as represented by ethyl cellulose polyalkylene ether, etc.

When an image forming material, particularly a colored image forming material is formed by use of the light-sensitive composition to be used in the method of the present invention, the colored light-sensitive layer can be also divided into two layers of a colored layer comprising a colorant and a binder and a light-sensitive layer comprising a light-sensitive composition. In this case, either layer may be arranged on the support side.

When an image forming material is constituted by use of the light-sensitive composition to be used in the method of the present invention, any desired support may be used, but a transparent support may be preferably used. As the transparent support, polyester film, particularly biaxial stretched polyethylene terephthalate film is preferred with respect to dimensional stability to water, heat. Otherwise, acetate film, polyvinyl chloride film, polyethylene film, polypropylene film, polyethylene film, etc. can be used.

The image forming material thus obtained can be used in the form of transferring an image onto an image receiving material. For effecting transfer onto the image receiving material and facilitating peel-off of the support after image transfer, namely enhancing releasability between the support and the image forming layer, a release treatment can be applied on the support surface, or a release layer can be provided on the support surface. These are described hereinbelow.

In the image forming method of the present invention, the image forming material is generally developed after imagewise exposure through a color separation mask, etc. to form an image. At this time, only the image portion is directly transferred and laminated onto an image receiving material from the image obtained on the support. That is, only the colored image layer forming substantially the image is transferred and laminated. In this case, for effecting transfer onto the image receiving surface and facilitating peeling of the support after image transfer, it is preferable to apply a release treatment on the support surface with an appropriate oil repellant substance or provide a release layer on the support.

As such oil repellant substance, for example, silicone resins, fluorine resins, fluorine type surfactants, polyolefins, polyamides, etc. can be used, and as the release layer, for example, there can be used alcohol soluble polyamide, alcohol soluble nylon, blend of partially esterified resin of copolymer of styrene and maleic anhydride with methoxymethylated nylon, polyvinyl acetate, polyacrylate, copolymer of polymethyl methacrylate and acrylate, polyvnyl chloride, copolymer of vinyl chloride and vinyl acetate, polyvinyl butyrate, cellulose acetate phthalate, methyl cellulose, ethyl cellulose, cellulose diacetate, cellulose triacetate, polyvinyl alcohol, butyl cellulose, hydroxyethyl cellulose, carboxymethyl cellulose, cyanoethyl cellulose, cellulose acetate, cellulose triacetate, cellulose acetate butyrate, hydroxypropylmethyl cellulose phthalate, hydroxypropylmethyl cellulose hexahydrophthalate, or mixtures of these.

The thickness of the release layer may be preferably within the range of 0.01 $\mu$m to 100 $\mu$m, particularly preferably 0.1 $\mu$m to 50 $\mu$m.

For enhancing releasability, as a particularly preferred embodiment, there may be included an example as a polypropylene layer or a polyethylene layer thinner than the thickness of the support is prepared.

As a preferable example of the polyethylene layer to be used in the present invention there may be included ethylene-vinyl acetate copolymer resin, those having a vinyl acetate ratio within said copolymer resin within the range of 5 % to 33 % are preferable, and the VICAT softening point of said resin should be preferably 80° C. or lower. Also, in the ethylene-vinyl acetate copolymer of the present invention, various polymers, super-cooling substances, surfactants, release agents, etc. can be added within the range such that the softening point may not exceed 80° C.

As the method for providing a polypropylene layer or a polyethylene layer on the support, there may be included the following methods etc., namely:

(1) the so called dry lamination method, in which a solution of polyvinyl acetate, polyvinyl chloride, epoxy resin, polyurethane type resin, natural rubber, synthetic rubber, etc., dissolved in an organic solvent is used as the adhesive, these adhesives are applied on a support, dried in hot air or by heating, and then a polypropylene film or a polyethylene film is superposed thereon, followed by lamination by pressure contact under heating;

(2) the so called hot melt lamination method in which a copolymer of ethylene and vinyl acetate, a copolymer of ethylene and an acrylic acid ester, a polyamide resin, a petroleum resin, rosins, waxes or a mixture of these is used as the adhesive, these adhesives are applied on a support while maintaining the molten state by heating them as such by the doctor blade method, the roll coating method, the gravure method, the reverse roll method, etc., and then immediately a polypropylene film or a polyethylene film is plastered thereon, followed by, if necessary, heating to a high temperature and then cooling, to effect lamination;

(3) the so called extrusion lamination method, in which polypropylene or polyethylene is maintained under the molten state, extruded into a film through an extruder, and laminated by pressure contact of a support while this is still under the molten state;

(4) the so called co-extrusion method, in which during molding of a film which becomes a support by the melt extrusion method, by use of a plurality of extruders are employed, and the film is extruded at one time together with polypropylene or polyethylene, thereby forming a polypropylene layer or a polyethylene film on the support film.

In the image forming method of the present invention, the developer to be used for developing the image forming material may be any desired one, provided that it has the developing action capable of developing the material to be processed. Preferably, a developer containing an alkali agent and an anionic surfactant may be used.

Available alkali agents may include:

(1) inorganic alkali agents such as sodium silicate, potassium silicate, potassium hydroxide, sodium hyroxide, lithium hydroxide, secondary or tertiary sodium phosphate or ammonium salt, sodium metasilicate, sodium carbonate, ammonia, etc.;

(2) organic amine compounds such as mono-, di- or trimethylamine, mono- di- or triethylamine, mono- or diisopropylamine, n-butylamine, mono-, di- or triethanolamine, mono-, di- or triisopropanol amine, ethyleneimine, ethylenediimine, etc.

Available anionic surfactants may include:

(1) higher alcohol sulfuric acid esters (e.g. sodium salt of lauryl alcohol sulfate, ammonium salt of octyl alcohol sulfate, ammonium salt of lauryl alcohol sulfate, secondary sodium alkyl sulfate, etc.);

(2) aliphatic alcohol phosphoric acid esters (e.g. sodium salt of cetyl alcohol phosphate, etc.);

(3) alkylaryl sulfonic acid salts (e.g. sodium dodecylbenzene sulfonate, sodium isopropylnaphthalene sulfonate, sodium dinaphthalene sulfonate, sodium metanitrobenzene sulfonate, etc.);

(4) alkylamide sulfonic acid salts

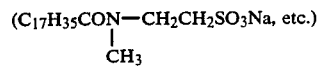

(5) sulfonic acid salts of dibasic aliphatic esters (e.g. sodium dioctyl sulfosuccinate, sodium dihexyl sulfosuccinate, etc.);

(6) formaldehyde condensates of alkylnaphthalene sulfonic acid salts (e.g. formaldehyde condensate of sodium dibutylnaphthalene sulfonate, etc.).

The alkali agent and the anionic surfactant can be used in any desired combination.

EXAMPLES

The present invention is described below by referring to Examples and Comparative examples.

As a matter of course, the present invention is not limited only to Examples described below, but can take various embodiments.

EXAMPLE 1

On the polypropylene surface of a support having a polypropylene film with a thickness of 25 μm laminated on a polyethylene terephthalate film with a thickness of 50 μm by the dry lamination method, a colored light-sensitive composition dispersing solution having the following composition was applied by use of a wire bar to a dry film thickness of 1 μm, followed by drying, to prepare a colored image forming material of four colors.

| | |
|---|---|
| t-Butylphenol-naphthoquinone-1,2-diazide-4-sulfonic acid ester | 0.616 g |
| Binder polymer shown below | 4.384 g |
| Pigment shown below | amount shown below |
| Ethyl cellosolve | 39.6 g |
| Fluorine type surfactant (FC-430 manufactured by 3M) | 0.25 g |

Binder polymer (Polymeric compound according to the present invention)

Vinyl acetate-vinyl versatate (80:20 parts by weight) copolymer
MN=22,000
MW=60,000

Pigments

| | |
|---|---|
| Black: Carbon Black MA-100 | 0.99 g |
| (manufactured by Mitsubishi Kasei) Cyan: Cyanine blue 4920 | 0.55 g |
| (manufactured by Dainichi Seika) Magenta: Seika Fast Carmine 1483 | 0.68 g |
| (manufactured by Dainichi Seika) Yellow: Seika Fast Yellow H-7055 | 0.68 g |
| (manufactured Dainichi Seika) | |

On the polyethylene terephthalate surface of the colored image forming material of four colors obtained as described above, the color separation dot positive films of the respective colors were superposed on one another, imagewise exposure was effected by a 4 KW metal halide lamp from a distance of 50 cm for 20 seconds, followed by development by dipping in the following developer for 30 seconds, to form a colored image of four colors.

Developer

| | |
|---|---|
| $Na_2CO_3$ | 15 g |
| Surfactant (Pelex NBL, manufactured by Kao-Atlas) | 50 g |
| Distilled water | 1000 g |

Next, the image surface of the black color image was brought into close contact with an art paper, passed through a pair of heated nip rolls under a pressurization condition of 5 kg/cm2 at a speed of 50 cm/min., and the support was peeled off. Peeling could be done easily, whereby only the black color image portion was transferred onto the art paper.

Subsequently, colored images were transferred in the order of cyan, magenta, yellow, whereby a color proofing image comprising four colors was obtained on the art paper. The transfer temperatures, the dimensional slippages between the four colors and the discoloration degrees with lapse of time of the images are shown in Table 1. In this Example, since only the image portion was transferred, finishing was very approximate to actual printed matter.

EXAMPLE 2

Colored image of four colors were formed in entirely the same manner as in Example 1 except for changing the colored light-sensitive composition dispersing solution to that shown below:

| | |
|---|---|
| 2-Trichloromethyl-5-[β-2-benzofuryl)vinyl]-1,3,4-oxadiazole | 0.145 g |
| Exemplary compound No. (19) of the compounds containing ortho-carbonate group shown above | 0.732 g |
| Binder polymer (the same as used in Example 1) | 4.384 g |
| Pigment (the same as used in Example 1) | amount shown below |
| Ethyl cellosolve | 39.6 g |
| Fluorine type surfactant (FC-430, manufactured by 3M) | 0.25 g | and transferred, whereby a color proofing image comprising four colors was obtained on an art paper. The transfer temperatures, dimensional slippages between the four colors, and the discoloration degree with lapse of the image are shown in Table 1. In this Example, since only the image portion was transferred, finishing

EXAMPLE 3

On the ethylene-vinyl acetate copolymer resin layer surface of a support having an ethylene-vinyl acetate copolymer resin layer (EVAFLEX P-1405 manufactured by Mitsui-Du Pont Chemical, vinyl acetate content: 14 % by weight, VICATE softening point 68° C.) with a thickness of 25 μm laminated by the extrusion lamination method on a polyethylene terephthalate film with a thickness of 75 μm, which has been coated with poly urethan type adhesive layer with a thickness of 0.2 μm, a colored light-sensitive composition dispersing solution having the following composition was applied by use of a wire bar to a dry film thickness of 1.5 μm, followed by drying, to prepare a colored image forming material of four colors.

| | |
|---|---|
| Ester compound of p-cresol novolak resin with naphthoquinone-1,2-diazide-4-sulfonic acid chloride | 0.616 g |
| Vinyl acetate-vinyl versatate copolymer (80:20 wt. %, weight average molecular weight 50,000, 50% methanolic solution) | 8.768 g |
| Pigment shown below | |
| Cyclohexanone | 35.2 g |
| Fluorine type surfactant (FC-430, manufactured by 3M) | 0.01 g |

Pigments

| | |
|---|---|
| Black: Carbon Black MA-100 (manufactured by Mitsubishi Kasei) | 0.99 g |
| Cyan: Lionol Blue-7730 (manufactured by Toyo Ink Co.) | 0.55 g |
| Magenta: Seika Fast Carmine 1483 (manufactured by Dainichi Seika) | 0.68 g |
| Yellow: No. 1206 Lionol Yellow (manufactured by Toyo Ink Co.) | 0.68 g |

On the polyethylene terephthalate surface of the colored image forming material of four colors obtained as described above, the color separation dot positive films of the respective colors were superposed on one another, imagewise exposure was effected by a 4 KW metal halide lamp from a distance of 50 cm for 20 seconds, followed by development by dipping in the following developer at 30° C. for 30 seconds, to form a colored image of four colors.

Developer

| | |
|---|---|
| Konica PS plate developer SDR-1 (manufactured by Konica) | 20 ml |
| Pelex NBL (manufactured by Kao-Atlas) | 50 ml |
| Distilled water | 400 ml |

Next, the image surface of the black color image was brought into close contact with an art paper, passed through a pair of nip rolls heated to 90° C. under a pressurization condition of 5 kg/cm² at a speed of 50 cm/min., and the support was peeled off. Peeling could be done easily at the interface between the ethylene-vinyl acetate copolymer resin layer and the colored image, whereby the black color image was transferred onto the art paper. Subsequently, colored images were transferred in the order of cyan, magenta, yellow, whereby a color proofing image comprising four colors was obtained on the art paper. On the art paper, only the colored image portion was transferred, namely the paper surface of the non-image portion was exposed, and the color proofing image obtained resembled extremely closely the image quality of the printed matter prepared by conventional off-set printing.

EXAMPLE 4

On the ethylene-vinyl acetate copolymer resin layer surface of a support having an ethylene-vinyl acetate copolymer resin layer (EVAFLEX P-1007 manufactured by Mitsui-DuPont Chemical, vinyl acetate content: 10% by weight, VICAT softening point 72° C.) with a thickness of 25 μm laminated by the extrusion lamination method on a polyethylene terephthalate film with a thickness of 75 μm which has been coated with poly urethan type adhesive layer with a thickness of 0.2 μm, a colored light-sensitive composition dispersing solution having the following composition was applied by use of a wire bar to a dry film thickness of 1.5 μm, followed by drying, to prepare a colored image forming material of four colors.

| | |
|---|---|
| Ester compound of p-cresol novolak resin with naphthoquinone-1,2-diazide-4-sulfonic acid chloride | 0.616 g |
| Vinyl acetate-vinyl stearate-2-ethylhexylacrylate copolymer (70:20:10 wt. %, weight average molecular weight: 70,000, 50% methanolic solution) | 8.768 g |
| Pigment shown below | |
| Cyclohexanone | 35.2 g |
| Fluorine type surfactant (FC-430, manufactured by 3M) | 0.01 g |

Pigments

| | |
|---|---|
| Black: Carbon Black MA-100 (manufactured by Mitsubishi Kasei) | 0.99 g |
| Cyan: Cyanine blue 4933GNEP (manufactured by Dainichi Seika) | 0.55 g |
| Magenta: Seika Fast Carmine 1483 (manufactured by Dainichi Seika) | 0.68 g |
| Yellow: Lionol Yellow-SGR-H (manufactured Toyo Ink Co.) | 0.68 g |

Subsequently, exposure, developing and image transfer processings were conducted in the same manner as in Example 3, to obtain a color proofing image comprising four colors on an art paper. On the art paper, only the colored image portion was transferred, namely the paper surface of the non-image portion was exposed, and the color proofing image obtained resembled extremely closely the image quality of the printed matter prepared by conventional off-set printing.

COMPARATIVE EXAMPLE 1

Example 1 was repeated except that the novolak resin shown below was used as the binder polymer and SDR-1 (Konica PS plate developer; manufactured by Konica K.K.) as the developer in the above Example 1.

The data are shown similarly as in Example described above in Table 1.

Binder polymer (novolak resin)

PR-50716 manufactured by Sumitomo Dures K.K. (novolak type phenol-formaldehyde resin)

The measurement results of the transfer temperatures, the dimensional slippages in the X-direction and the Y-direction, the coloration degrees with lapse of time of the colored light-sensitive binders concerning respective examples and comparative examples as described above are shown below in Table 1.

In Table 1, the dimensional slippage is shown in terms of the slippage ($\mu$m) in each direction between the register marks at the four corners of the image in the passing direction during transfer (defined as X-direction) and the width direction during transfer (defined as Y-direction). The register marks are arranged with distances of 400 mm in the X-direction and 600 mm in the Y-direction.

The coloration degree with lapse of time is a value of the binder coloration degree (brown coloration degree) of the transferred image onto a paper measured as the yellow reflection density. For measurement, a Macbeth reflection densitometer RD-918 was used. One which becomes greater in coloration degree with lapse of time is greater in discoloration to be poor in discoloration resistance. When the coloration degree becomes greater, particularly the colors of the transferred image of cyan, magenta and yellow become turbid, whereby image reproducibility is deteriorated.

TABLE 1

| No. | Transfer temperature (°C.) | Dimensional slippage ($\mu$m) | | Coloration degree with lapse of time of the colored light-sensitive layer | | |
|---|---|---|---|---|---|---|
| | | X-direction | Y-direction | 0 | 3 days | 7 days |
| Example 1 | 80 | 30 | 50 | 0.02 | 0.02 | 0.02 |
| Example 2 | 70 | 20 | 40 | 0.02 | 0.02 | 0.02 |
| Example 3 | 70 | 20 | 30 | 0.02 | 0.02 | 0.02 |
| Example 4 | 70 | 10 | 20 | 0.02 | 0.02 | 0.02 |
| Comparative example 1 | 120 | 200 | 300 | 0.02 | 0.08 | 0.17 |

As can be understood from Table 1, for Examples 1–4 of the present invention, good transfer can be accomplished even when the transfer temperature may be made relatively lower, and also dimensional slippage is small. In contrast, for Comparative example 1, considerably high temperatures are required for all concerning the transfer temperature, and dimensional slippages are by far greater as compared with Examples.

Also, referring to the coloration degree with lapse of time of the binder in the colored light-sensitive layer, for Examples 1–4 of the present invention, no coloration degree change can be seen, while in Comparative example 1, coloration degree is considerably changed, whereby it can be understood that considerable discoloration has occurred.

From Table I, it can be understood that dimensional slippage is small, and the coloration degree change with lapse of time of the colored light-sensitive layer binder is small in Examples of the present invention.

As described above, according to the present invention, there can be provided a light-sensitive composition and an image-forming method which requires no high temperature when made into the transfer type, can prevent dimensional slippage, and also is good in discoloration resistance.

We claim:

1. A color image forming method comprising the steps of:
   (I) imagewise exposing an image forming material wherein said image forming material comprises:
   (1) a support;
   (2) a releasing layer provided on said support wherein said releasing layer is formed of an ethylene-vinylacetate copolymer; and
   (3) a light-sensitive layer is provided on said releasing layer to produce an imagewise portion corresponding to said exposing step, said light-sensitive layer comprising
   (i) a colorant,
   (ii) light-sensitive o-quinonediazide compound or compositions containing both of a photoacid generating agent and a compound having a bond decomposable with an acid, and
   (iii) a polymeric compound which is
   (a) a homopolymer of a first monomer represented by the formula:

wherein R in said first monomer is an alkyl having 1 to 17 carbon atoms; or
   (b) a copolymer comprising said first monomer and a second monomer;
   (II) developing said image forming material and
   (III) transferring said imagewise portion of said light-sensitive layer onto an image receiving material wherein said releasing layer remains on said support.

2. The image forming method according to claim 1, wherein the content of said photoacid generating agent is 0.1 to 10 % by weight in the total solids of said light-sensitive composition, and the content of the compound having at least one bond decomposable with said acid is 5 to 70 % by weight in the total solids of said light-sensitive composition.

3. The image forming method according to claim 1, wherein the content of said o-quinonediazide compound in the light-sensitive composition is 5 to 50 % by weight in the total solids of said light-sensitive composition.

4. The image forming method according to claim 1 wherein the content of said polymeric compound in the total solids of said light-sensitive composition is 30 to 95 % by weight.

5. The image forming method according to claim 1, wherein said photoacid generating agent is selected from the group consisting of diazonium salts, phosphonium salts, sulfonium salts, and iodonium salts of $BF_4-$, $PF_8-$, $SbF_8-$, $SiF_8{}^{2-}$, $ClO_4-$, organic halogen compounds, o-quinonediazidesulfonyl chloride, organometallic compound and organic halide compounds.

6. The image forming method according to claim 1, wherein said compound having at least one bond decomposable with said acid is a compound having a bond selected from the group of

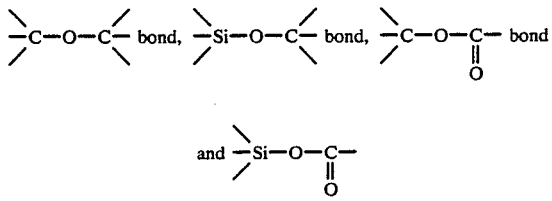

bond.

7. The image forming method according to claim 1, wherein said compound having at least one bond decomposable with said acid is a compound having at least one ortho-carbonate group represented by the following formula (X):

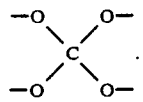

8. The image forming method according to claim 1, wherein said o-quinonediazide compound is selected from the group consisting of compounds obtained by condensation of 1,2 -benzoquinonediazide-4-sulfonyl chloride, 1,2-naphthoquinonediazide-4-sulfonyl chloride, 1,2-naphthoquinonediazide-5-sulfonyl chloride, 1,2-naphthoquinonediazide-6-sulfonyl chloride with at least one of hydroxyl group containing compounds and amino group containing compounds.

9. The image forming method according to claim 1, wherein said polymeric compound as carboxylic acid vinyl ester monomer for constituting the polymer unit has ones selected from the group consisting of vinyl acetate and vinyl versatate.

10. The image forming method according to claim 1, wherein said polymeric compound has 40 to 95% by weight of said polymer compound structure unit in the molecular structure and has a number average molecular weight (MN) of 1,000 to 1000,000 and a weight average molecular weight (MW) of 5,000 to 500,000.

11. The image forming method according to claim 8, wherein said o-quinonediazide compound is selected from the group consisting of compounds obtained by condensation of 1,2-naphthoquinonediazie-4-sulfonyl chloride with at least one of hydroxyl group containing compounds and amino group containing compounds.

12. The image forming method according to claim 11, wherein said o-quinonediazide compound is selected from the group consisting of compounds obtained by condensation of 1,2-naphthoquinonediazide-4-sulfonyl chloride with hydroxyl group containing compounds.

13. The image forming method according to claim 12, wherein said o-quinonediazide compound is selected from the group consisting of a compound obtained by condensation of 1,2-naphthoquinonediazide-4-sulfonyl chloride with p-cresol novolak resin.

14. The image forming method according to claim 9, wherein said polymeric compound comprises carboxylic acid vinyl ester monomer for constituting the polymer unit selected from the group consisting of vinyl acetate and vinyl versatate or a combination thereof.

15. The image forming method according to claim 14, wherein said carboxylic acid vinyl ester monomer consists of both vinyl acetate and vinyl versatate.

16. The image forming method according to claim 9, wherein said o-quinonediazide compound is compound obtained by condensation of 1,2-naphthoquinonediazide-4-sulfonyl chloride with p-cresol novolak resin, and said polymeric compound comprises a carboxylic acid vinyl ester monomer for constituting the polymer unit selected from the group consisting of vinyl acetate and vinyl versatate or a combination thereof.

17. The image forming method according to claim 1, wherein the content of said photoacid generating agent is 0.1 to 10 % by weight in the total solids of said light-sensitive composition, and the content of the compound having at least one bond decomposable with said acid is 5 to 70 % by weight in the total solids of said light-sensitive composition,
said photoacid generating agent is selected from the group consisting of diazonium salts, phosphonium salts, sulfonium salts, and iodonium salts of $BF_4^-$, $PF_8^-$, $SbF_8^-$, $SiF_8^{2-}$, $ClO_4^-$, organic halogen compounds, O-quinonediazidesulfonyl chloride, organometallic compounds and organic halide compounds.

18. The method of claim 1 wherein the first monomer is vinyl acetate, vinyl propionate or vinyl versatate.

19. The method of claim 1 wherein the homopolymer is used.

20. The method of claim 1 wherein the copolymer is used.

21. The method of claim 20 wherein the copolymer is vinyl acetate-ethylene; vinyl cetate-styrene; vinyl acetate-vinyl propionate; or vinyl acetate-vinyl versatate.

22. The method of claim 20 wherein the copolymer is
(1) vinyl acetate-ethylene;
(2) vinyl acetate-styrene;
(3) vinyl acetate-crotonic acid;
(4) vinyl acetate-maleic acid;
(5) vinyl acetate-2-ethylhexyl acrylate;
(6) vinyl acetate-2-ethylhexyl maleate;
(7) vinyl acetate-methyl vinyl ether;
(8) vinyl acetate-vinyl chloride;
(9) vinyl acetate-N-vinylpyrrolidone;
(10) vinyl acetate-vinyl propionate;
(11) vinyl acetate-vinyl pivalate;
(12) vinyl acetate-vinyl versatate;
(13) vinyl acetate-vinyl laurate;
(14) vinyl acetate-vinyl stearate;
(15) vinyl acetate-vinyl versatate-ethylene;
(16) vinyl acetate-vinyl versatate-2-ethylhexyl acrylate;
(17) vinyl acetate-vinyl versatate-vinyl laurate;
(18) vinyl acetate-vinyl versatate-crotonic acid;
(19) vinyl propionate-vinyl versatate;
(20) vinyl propionate-vinyl versatate-crotonic acid or
(21) pivalic acid-vinyl stearate-maleic acid 23. A color image forming material comprising:
(1) a support;
(2) a releasing layer provided on said support wherein said releasing a layer is formed of an ethlyene-vinylacetate copolymer; and
(3) a light-sensitive layer provided on said releasing layer to produce an imagewise portion corresponding to said exposing step wherein said light-sensitive layer comprises (i) a colorant,
(ii) light-sensitive o-quinonediazide compound or compositions containing both of a photoacid generating agent and a compound having a bond decomposable with an acid, and
(iii) a polymeric compound which is
(a) a homopolymer of a first monomer represented by the formula:

RCCOCH=CH$_2$ wherein R in said first monomer is an alkyl having 1 to 17 carbon atoms; or
(b) a copolymer comprising said first monomer and a second monomer;
whereby said releasing layer remains on said support after said imagewise portion of said light-sensitive layer is transferred onto an image receiving material.

24. The color image forming material according to claim 23 wherein the content of said photoacid generating agent is 0.1 to 10 % by weigh tin the total solids of said light-sensitive composition, and the content of the compound having at least one bond decomposable with said acid is 5 to 70% by weight in the total solids of said light-sensitive composition.

25. The color image forming material according to claim 23 wherein the content of said o-quinonediazide compound in the light-sensitive composition is 5 to 50% by weight in the total solids of said light-sensitive composition.

26. The color image forming material according to claim 23 wherein the content of said polymeric compound in the total solids of said light-sensitive composition is 30 to 95 % by weight.

27. The color image forming material according to claim 23 wherein said photoacid generating agent is selected from the group consisting of diazonium salts, phosphonium salts, sulfonium salts, and iodonium salts of BF$_4^-$, PF$_8^-$, SbF$_8^-$ SiF$_8^{2-}$, ClO$_4^-$, organic halogen compounds, o-quinone, diazidesulfonyl chloride, organometallic compound and organic halide compounds.

28. The color image forming material according to claim 23, wherein said compound having at least one bond decomposable with said acid is a compound having a bond selected from the group consisting of

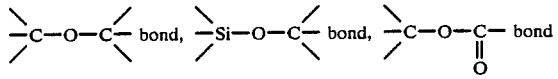

and 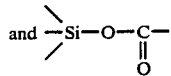

bond.

29. The color image forming material according to claim 23, wherein said compound having at least one bond decomposable with said acid is a compound having at least one ortho-carbonate group represented by the following formula (X):

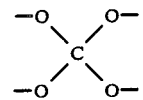

30. The color image forming material according to claim 23, wherein said o-quinonediazide compound is selected from the group consisting of compounds obtained by condensation of 1,2-benzoquinonediazide-4-sulfonyl chloride, 1,2-naphthoquinonediazide-4-sulfonyl chloride, 1,2-naphthoquinonediazide-5-sulfonyl chloride, 1,2-naphthoquinonediazide-6-sulfonyl chloride with at least one of hydroxyl group containing compounds and amino group containing compounds.

31. The color image forming material according to claim 23, wherein said polymeric compound as carboxylic acid vinyl ester monomer for constituting the polymer unit has ones selected from the group consisting of vinyl acetate and vinyl versatate.

32. The color image forming material according to claim 23, wherein said polymeric compound has 40 to 95% by weight of said polymer compound structure unit in the molecular structure and has a number average molecular weight (MN) of 1,000 to 100,000 and a weight average molecular weight (MW) of 5,000 to 500,000.

33. The color image forming material according to claim 23, wherein said o-quinonediazide compound is selected from the group consisting of compounds obtained by condensation of 1,2-naphthoquinonediazide-4-sulfonyl chloride with at least one of hydroxyl group containing compounds and amino group containing compounds.

34. The color image forming material according to claim 33, wherein said o-quinonediazide compound is selected from the group consisting of compounds obtained by condensation of 1,2-naphthoquinonediazide-4-sulfonyl chloride with hydroxyl group containing compounds.

35. The color image forming material according to claim 33, wherein said o-quinonediazide compound is selected from the group consisting of a compound obtained by condensation of 1,2-naphthoquinonediazide-4-sulfonyl chloride with p-cresol novolak resin.

36. The color image forming material according to claim 23, wherein said polymeric compound comprises carboxylic acid vinyl ester monomer for constituting the polymer unit selected from the group consisting of vinyl acetate and vinyl versatate or a combination thereof.

37. The color image forming material according to claim 36, wherein said carboxylic acid vinyl ester monomer consists of both vinyl acetate and vinyl verstate.

38. The color image forming material according to claim 37, wherein said o-quinonediazide compound is compound obtained by condensation of 1,2-naphthoquinonediazide-4-sulfonyl chloride with p-cresol, novolak resin, and said polymeric compound comprises a carboxylic acid vinyl ester monomer for constituting the polymer unit selected from the group consisting of vinyl acetate and vinyl versatate or a combination thereof.

39. The color image forming material according to claim 23, wherein the content of said photoacid generating agent is 0.1 to in % by weight in the total solids of said light-sensitive composition, and the content of the compound having at least one bond decomposable with said acid is 5 to 70 % by weight in the total solids of said light-sensitive composition, and said photoacid generating agent is selected from the group consisting of diazonium salts, phosphonium salts, sulfonium salts, and iodonium salts of $BF_4-$, $PF_4-$, $SbF_8-$, $SiF_8{}^{2-}$, $ClO_4-$, organic halogen compounds, o-quinone, diazidesulfonyl chloride, organometallic compound and organic halide compounds.

40. The color image forming material according to claim 39 wherein the first monomer is vinyl acetate, vinyl propionate or vinyl versatate.

41. The color image forming material according to claim 39 wherein the homopolymer is used.

42. The color image forming material according to claim 39 wherein the copolymer is used.

43. The color image forming material of claim 42 wherein the copolymer is vinyl acetate-ethylene; vinyl acetate-styrene; vinyl acetate-vinyl propionate; or vinyl acetate-vinyl versatate.

44. The color image forming material of claim 42 wherein the copolymer is
vinyl acetate-crotonic acid;
vinyl acetate-maleic acid;
vinyl acetate-2-ethylhexyl acrylate;
vinyl acetate-2-ethylhexyl maleate;
vinyl acetate-methyl vinyl ether;
vinyl acetate-vinyl chloride;
vinyl acetate-N-vinylpyrrolidone;
vinyl acetate-vinyl laurate;
vinyl acetate-vinyl stearate;
vinyl acetate-vinyl versatate-ethylene;
vinyl acetate-vinyl versatate-2-ethylhexyl acrylate;
vinyl acetate-vinyl versatate-vinyl laurate;
vinyl acetate-vinyl versatate-crotonic acid;
vinyl propionate-vinyl versatate;
vinyl propionate-vinyl versatate-crotonic acid or pivalic acid-vinyl stearate-maleic acid.

* * * * *